United States Patent

[11] 3,628,107

[72] Inventor Richard W. Kennedy
Skaneateles, N.Y.
[21] Appl. No. 821,684
[22] Filed May 5, 1969
[45] Patented Dec. 14, 1971
[73] Assignee General Electric Company

[54] PASSIVATED SEMICONDUCTOR DEVICE WITH PERIPHERAL PROTECTIVE JUNCTION
8 Claims, 10 Drawing Figs.

[52] U.S. Cl. .......... 317/235 R,
317/235 AB, 317/235 AJ, 317/234 F
[51] Int. Cl. .......... H01l 11/10
[50] Field of Search .......... 317/235
(47), 235 (41.1), 234 (72.11), 234, 235, 234 (3), 234 (3.1)

[56] References Cited
UNITED STATES PATENTS 3,300,694 1/1967 Stehney .......... 317/235
3,491,272 1/1970 Huth .......... 317/234
3,283,224 11/1966 Erkan .......... 317/234
3,492,174 1/1970 Nakamura .......... 148/175
3,280,386 10/1966 Philips .......... 317/234

*Primary Examiner*—John W. Huckert
*Assistant Examiner*—Martin H. Edlow
*Attorneys*—Robert J. Mooney, Nathan J. Cornfeld, Carl O. Thomas, Frank L. Neuhauser, Oscar B. Waddell and Joseph B. Forman

ABSTRACT: A semiconductive crystal having a central zone of relatively high resistivity is provided with glassed grooves adjacent its opposite major surfaces spaced inwardly from its edge. A peripheral zone forms a junction with the central zone spacing it inwardly from the outer edge of the crystal. A rectifying junction lies inwardly of the grooves adjacent the central zone. Both the peripheral and rectifying junctions are passivated by edge intersection with the glassed grooves.

Figure 1:
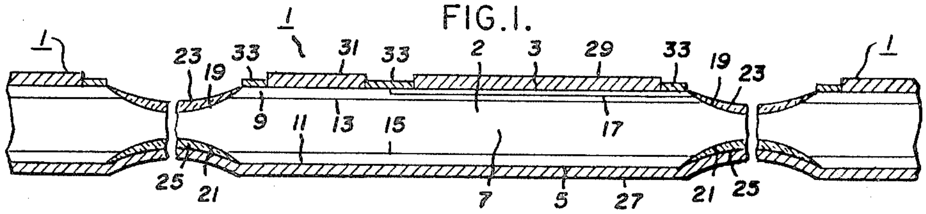

INVENTOR:
RICHARD W. KENNEDY,

BY Carl O. Thomas
HIS ATTORNEY.

Patented Dec. 14, 1971 3,628,107

2 Sheets-Sheet 2

INVENTOR:
RICHARD W. KENNEDY,
BY Carl O. Thomas
HIS ATTORNEY.

PASSIVATED SEMICONDUCTOR DEVICE WITH PERIPHERAL PROTECTIVE JUNCTION

My invention is directed to a semiconductor device having a semiconductive crystal associated with a junction passivant in a manner to improve the electrical properties of the semiconductor device and the mechanical properties of the passivated semiconductive crystal.

It is by now well understood how to manufacture semiconductor devices capable of blocking extremely high voltage differentials across their terminals. Unfortunately, the structural arrangements which result in the most desirable electrical characteristics have been largely limited in applicability to manufacturing approaches in which each semiconductive crystal or pellet to be incorporated into a semiconductor device is separately processed and handled.

Because of the extreme cost competitiveness of the semiconductor industry, manufacturing techniques have been developed capable of simultaneously processing semiconductive crystals or pellets for a large number of semiconductor devices while still associated within a single large crystal-line disc or wafer. Wafer processing has greatly reduced the unit cost of semiconductive crystals and hence the cost of the semiconductor devices. However, the advantages of mass handling of semiconductive pellets are obtained by accepting relatively low level electrical performance capabilities and by the necessity of rejecting substantial quantities of completed semiconductor devices due to semiconductive crystal damage produced in fabrication. For example, whereas four-layer, three-junction thyristor pellets can be individually manufactured capable of reliably providing semiconductor devices capable of blocking terminal applied potentials well in excess of 1000 volts, thyristors having semiconductive crystals formed and processed en masse typically exhibit voltage blocking characteristics well below 400 volts. This is no disadvantage to applications requiring low-blocking voltage capabilities, but, obviously, the range of applications for such devices are limited by this parameter. Further, a substantial number of the semiconductor devices produced by such mass-handling techniques must be discarded or downgraded as failing to meet even these modest performance criteria due to mechanical damage in processing and assembly.

It is an object of my invention to provide a semiconductor device incorporating a semiconductive crystal having a structure compatible with low cost, multiple pellet-handling and fabricating techniques which exhibits improved electrical characteristics and which is less susceptible to in process damage. It is a more specific object of my invention to provide a conveniently manufacturable semiconductor device of improved blocking voltage characteristics.

These and other objects of my invention may be realized in one form by the combination comprised of a semiconductor crystal having first and second major surfaces. A central zone lies between and spaced from the major surfaces and is of a first conductivity type. First and second zones lie between the central zone and the first and second major surfaces, respectively, of the semiconductor crystal. The central zone exhibits a greater width and a higher resistivity than either of the first and second zones. The central zone forms first and second junctures with the first and second zones, respectively. First and second circumferential border grooves spaced inwardly from an outer edge of the crystal are associated with the first and second major surfaces, respectively, and extend inwardly therefrom to intersect the first and second junctures. A peripheral zone forms an annular junction with the central zone and is separated by the grooves from the first and second zones. Dielectric passivant means overlie the intersections of the junction and the junctures with the grooves.

Figure 2:
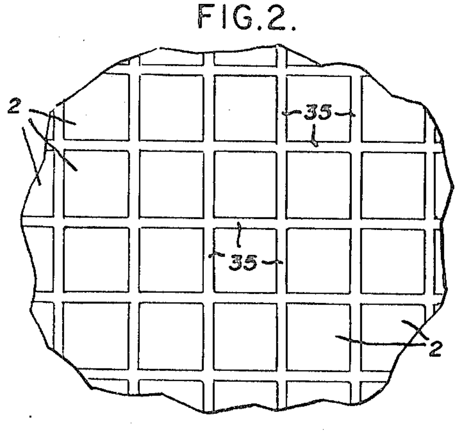
Figure 3:
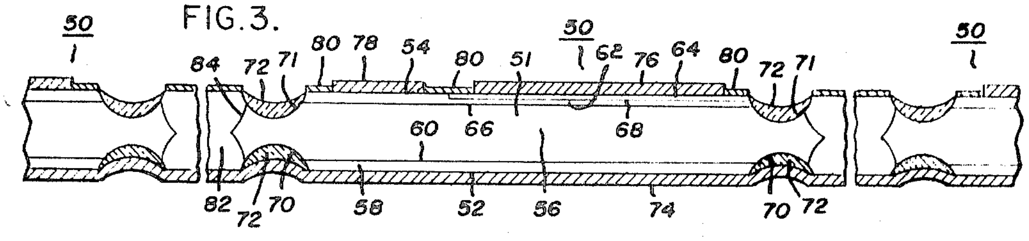
Figures 4, 5:
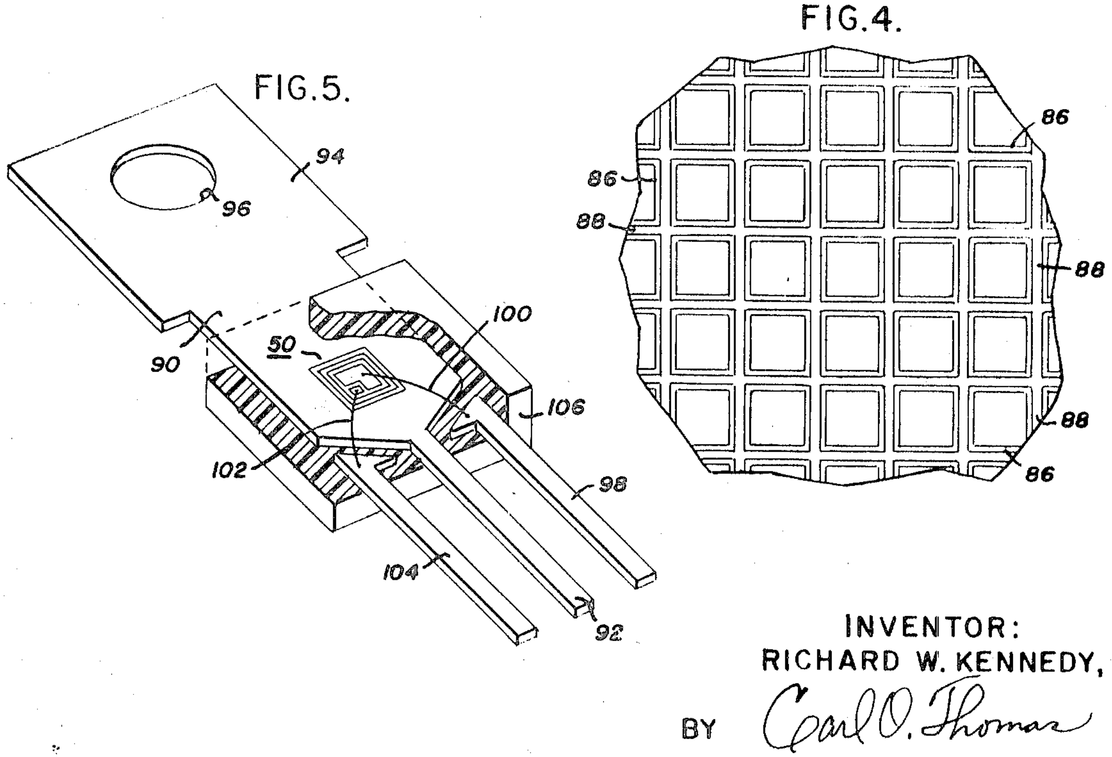
Figure 6:
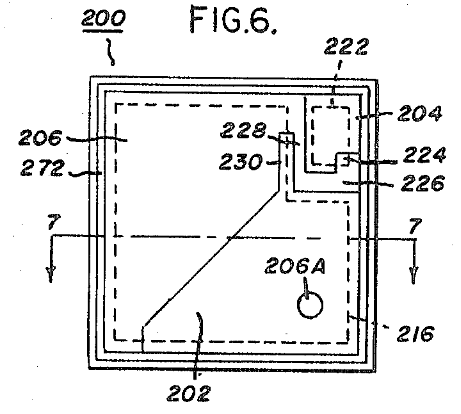
Figure 8:
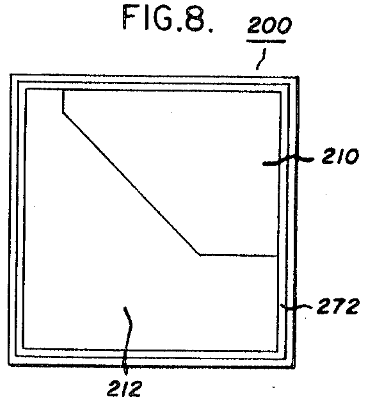
Figure 7:
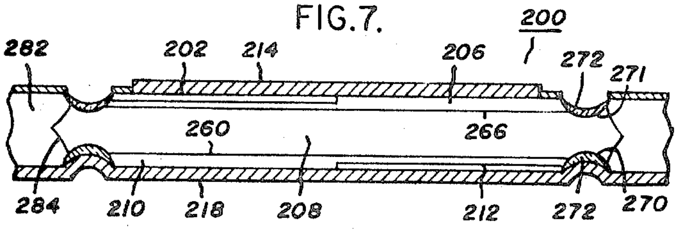
Figure 9:
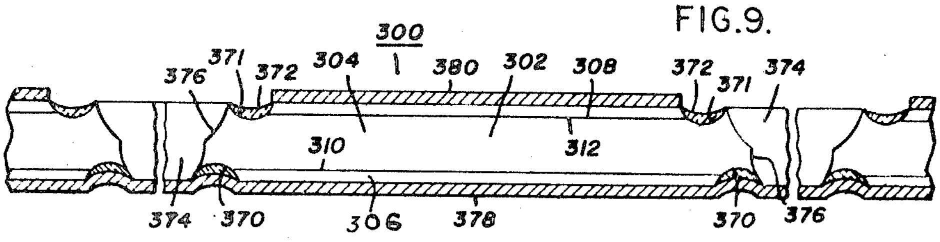
Figure 10:
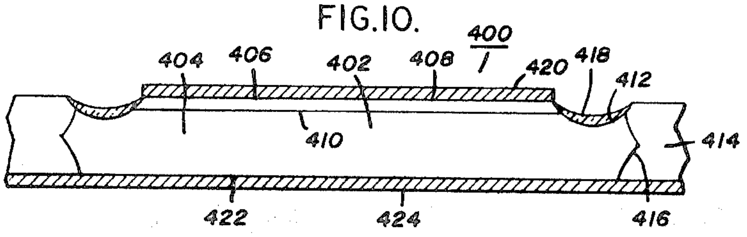

In other aspect my invention is directed to the combination comprised of a semiconductive crystal having a first major surface with a central zone lying within the crystal spaced from the first major surface. A first zone lies between the central zone and the first major surface. The first zone is of a conductivity type differing from that of the central zone and forms a first junction therewith. A circumferential border groove is spaced inwardly from an outer edge of the crystal and extends inwardly from the first major surface to intersect the first junction. A peripheral zone of a conductivity type differing from that of the central zone forms an annular junction with the central zone, and the annular junction intersects the groove so that the peripheral zone is separated by the groove from the first zone. A dielectric passivant means overlies the intersections of the junctions with the groove. My invention may be better understood by reference to the following detailed description considered in conjunction with the drawings, in which FIG. 1 is a vertical section of conventional semiconductive assemblies as they would appear immediately after separation from a common wafer, FIG. 2 is a detail of a wafer from which the assemblies of FIG. 1 may be formed, FIG. 3 is a vertical section of semiconductive assemblies according to my invention as they would appear immediately after separation from a common wafer, FIG. 4 is a detail of a wafer from which the assemblies of FIG. 3 may be formed, FIG. 5 is an isometric view of a semiconductor device formed according to my invention with a portion shown in section, FIG. 6 is a plan view of another form of a semiconductive assembly formed according to my invention with the contacts indicated by dashed lines, FIG. 7 is a section taken along line 7—7 in FIG. 6, FIG. 8 is a bottom view of the semiconductive assembly of FIG. 6 and 7, but with the lower contact removed, FIG. 9 is a vertical section of alternate semiconductive assemblies according to my invention as they would appear immediately after separation from a common wafer, and FIG. 10 is a vertical section of still another semiconductive assembly according to my invention. As appreciation of my invention and its distinct advantages can be readily gained by comparison with a conventional structure now in commercial use. In FIG. 1 a plurality of conventional semiconductive assemblies 1 are shown as they would appear immediately after being subdivided from a single large crystalline disc or wafer. Each of the assemblies is formed of a semiconductive pellet or crystal 2 having first and second major surfaces 3 and 5 which are substantially parallel. The crystal is provided with a central zone 7 which is typically of N-type conductivity. A first zone 9 and a second zone 11 of a P-type conductivity are interposed between the central zone and the first and second major surfaces, respectively, and form junctions 13 and 15 with the central zone. A third zone 17 is interposed between a portion of the first zone and the first major surface, but spaced from the central zone. Typically the third zone is formed of N+ conductivity. The periphery of each crystal is provided with an upper curved edge 19 that intersects the peripheral edge of the junction 13 and a lower curved edge 21 that intersects the peripheral edge of the junction 15. Glass passivant layers 23 and 25 are associated with the upper and lower curved edges to protect the junctions 13 and 15. A metallic contact 27 overlies the lower surface of the semiconductive crystal and the passivant layer 25. The contact is comprised of one or more metal layers that provide an ohmic contact to the second layer 11. A contact 29 is associated with the third layer in ohmically conductive relation. A control contact 31 ohmically engages a portion of the first layer lying along the first major surface. The portion of the upper surface of the semiconductive crystal not covered by glass passivant or contacts is protected by a thin oxide layer 33, typically silicon dioxide or silicon nitride.

It may be readily seen that the semiconductive assemblies 1 when associated with terminal leads and casings are each suited to form the semiconductively active portion of a semiconductor controlled rectifier. Typically the contact 27 would be associated with an anode lead, the contact 29 with a cathode lead, and the contact 31 with a gate or control lead. As a controlled rectifier the junction 13 must block the forward voltage prior to switching to a conductive mode by a proper gate signal, and the junction 15 must withstand peak inverse voltages.

The semiconductive crystals 2 of the assemblies 1 of FIG. 1 are initially joined in a single crystalline wafer as shown in FIG. 2. Initially the wafer exhibits the conductivity characteristics of the central zone 7. The junctions 13 and 15 and zones 9 and 11 are formed by diffusing from the first and second major surfaces. The third zone 17 may be formed by diffusion or by alloying. In order to passivate the junctions at the edge of each crystal assembly aligned grooves 35 may be etched from the opposite major surfaces to form the curved edges 19 and 21 that intersect the junctions 13 and 15, respectively. The glass passivant layers 23 and 25 are then deposited in the grooves. The contacts are typically applied after the glass passivant layers are fully formed. Where the contact 27 is applied by vapor plating it may overlie the glass 25 as shown. It is appreciated that the metal contacts may be of any conventional type and typically formed of a plurality of different metals and metal layers. The wafer is subdivided into individual assemblies 1 only after each of the above operations have been fully accomplished. Thus, a very low cost process of fabrication is afforded, since each step may be performed simultaneously on each semiconductive crystal 2 while it is contained in the wafer and, usually, a plurality of wafers may be simultaneously processed.

While the semiconductive assemblies 1 have been shown to meet commercial requirements, they nevertheless exhibit certain disadvantages. First, in forming aligned grooves 35 in a wafer containing the integrally joined semiconductive crystals, the wafer may be substantially weakened along spaced parallel planes running in two directions as is shown in FIG. 2. It can be seen that each semiconductive crystal 2 is integrally joined with adjacent crystals 2, but the grooves 35 separating and demarcating the crystals substantially weaken this integral interconnection and greatly weaken the wafer viewed as a whole. This then requires that the wafers be carefully treated in processing to avoid inadvertent breakage along the grooves. Another disadvantage is that when semiconductive assemblies are subdivided along the glass grooves by scribing or sawing, the glass associated with both the upper and lower grooves must be fractured. Since glass is typically a brittle material, this affords an opportunity to introduce cracks into the glass that will allow contaminants to penetrate to the blocking junctions. An adverse effect on the voltage blocking characteristics of the device follows. If the glass utilized exhibits a thermal coefficient of expansion even slightly greater than that of the semiconductive wafer, the tendency toward fracture of the glass is greatly increased and damage to the crystal itself may also occur. That is, as the glass fractures small pieces of the crystal may actually be broken loose. Further disadvantages are attributable to the fact that the central zone extends outwardly to the scribed or sawn edge. Thus if the glass layer 25 is fractured or if solder associated with the contacts 27 in mounting the assembly to a heat sink or lead inadvertently touches the sawn edge of the crystal, the central zone may be shorted to the anode terminal of the semiconductor device through this path. Even if neither of these possible sources of shorting occur, however, performance may still be compromised. Since the central zone typically has a much lower impurity level than the first and second zones, the space charge region which is associated with a junction in the blocking state will spread farthest from the junction in the central zone. If the depletion layer spreads sufficiently to contact the sawn edge of the central zone, a softening of the breakdown characteristics of the crystal occurs, possibly attributable to surface charge or impurities at the sawn edge. Yet another disadvantage of the semiconductive assemblies 1 is that the portion of each crystal extending beyond the major surfaces are cantilevered when the crystal is mounted into a semiconductor device. Since semiconductive crystals are typically quite thin, usually only a few mils, the cantilevered edges are quite fragile and easily damaged in handling and mounting the crystals.

In FIG. 3 a plurality of semiconductive assemblies 50 are shown generally comparable to the conventional semiconductive assemblies 1, but incorporating certain unique structural features characteristic of my invention. The assemblies are each comprised of a semiconductive crystal 51 having first and second spaced, substantially parallel major surfaces 52 and 54. A central zone 56 is incorporated within the crystal of a first conductivity type, typically N-type conductivity. A first zone 58 is interposed between the central zone and the first major surface 52. The first zone is of a conductivity type differing from that of the central zone, typically of P-type conductivity, and forms a first junction 60 with the central zone.

A second zone 62 lies between the central zone and the second major surface of the crystal. A third zone 64 is interposed between a portion of the second zone and the second major surface. The third zone is spaced from the central zone and generally lies along the second major surface. Where the central zone is of N-type conductivity, the second zone is of P-type conductivity and the third zone is of N+-type conductivity. The second zone forms a junction 66 with the central zone, while the second and third zones form a junction 68. First and second grooves 70 and 71 are spaced inwardly from the edge of the semiconductive crystal and extend inwardly from the first and second major surfaces, respectively, of the crystal. The first groove intersects the peripheral edge of the junction 60 while the second groove intersects the peripheral edge of the junctions 68 and 66.

Located within the grooves are dielectric passivant material layers 72, typically formed of a dielectric glass. It is noted that the lower edge of the semiconductive crystal interiorly and exteriorly of the groove 70 lies along the first major surface and the entire first major surface including the layer 72 is covered by a first ohmic conductive contact layer 74. A second contact layer 76 is similarly associated with the third zone at the second major surface. A third or control contact layer 78 is similarly associated with a portion of the second zone lying adjacent the second major surface. The portion of the second major surface not covered by the second and third contact layers are covered with an oxide or nitride layer 80, which is typically silicon dioxide or silicon nitride.

It is a unique feature of my invention that the semiconductive crystal 51 is provided with a peripheral zone 82 adjacent its outer edge. The peripheral zone is of a conductivity type opposite to that of the central zone and forms a junction 84 with the central zone. The peripheral zone is noted to extend between the first and second major surfaces of the crystal exteriorly of the grooves while the junction 84 is noted to be intersected at its opposite edges by the grooves 70 and 71.

The semiconductive crystals 51 of FIG. 3 may be initially joined in a single crystalline wafer. Preferably the wafer initially exhibits the conductivity characteristics of the central zone 56. The major surfaces 52 and 54 of the wafer may be masked with an oxide or nitride, such as silicon dioxide or silicon nitride, or with any other conventional diffusion masking material. The masking material is then selectively stripped from the major surfaces along a first set of parallel corridors which lie along both the major surfaces and which are in alignment on the opposite major surfaces. A second set of parallel corridors are oriented to intersect the first set and are likewise in alignment on the opposite major surfaces. The first and second sets of corridors are usually simultaneously formed. The general pattern may be similar to that shown in FIG. 2, if it is assumed that in this instance the reference numerals 35 are directed merely to bared corridors rather than grooves.

The wafer is exposed to a diffusant which penetrates the wafer along the corridors to form the peripheral zone 82. Where the waver was initially of N-type conductivity, the peripheral zone would be formed by a P-type diffusant. With thin wafers diffusion may be accomplished from one major surface rather than both, if desired. Next, the masking material may be removed from both major surfaces and diffusion of both major surfaces accomplished to form the first zone and the second zone. Thereafter, masking material may be reapplied to the first and second major surfaces, except that the masking material may be omitted or removed from the areas of the second major surface at which it is desired to form the third zones 64. After the third zones are formed, masking material is applied to these surfaces as well.

In a preferred, somewhat varied approach applicable to silicon dioxide masking material, the steps of removing the silicon dioxide from the entire first and second major surfaces to form the first zone and the second zone may be omitted. In this approach silicon dioxide is restored over the corridors and is removed only from the areas corresponding to the third zones. Gallium arsenide is used as a diffusant. As is well understood in the art gallium readily penetrates the silicon dioxide mask to form the central portion of the first zone and the second zone while the arsenic forms the N-type third zone. The silicon dioxide prevents arsenic penetration into the first or second zones, however. Thereafter the entire surface of the wafer is provided with a coating of masking material.

After masking is completed, masking material is selectively removed from areas on the major surfaces which are intended to overlie the grooves 70 and 71. The configuration is best appreciated by reference to FIG. 4, in which a plurality of bared annular areas 86 corresponding in configuration to the desired configuration of the grooves 70 and 71 are formed spaced apart by intersecting streets 88. Exposing the major surfaces to etchant over the bared areas 86 forms the grooves. It is to be noted that the grooves are formed of a depth to intersect both the peripheral edge of the junctions 60, 66, and 84. The grooves are formed to remove the portion of the crystals lying at the intersections of the junction 84 with the junctions 60 and 66. Thus, the junction 84 is spaced from the junctions 60 and 66 by the portion of the grooves formed by the central zone. The passivant layers 72 may be selectively deposited in the grooves by known techniques. For example, a glass passivant may be selectively deposited electrophoretically in the grooves as disclosed in Sheldon commonly assigned application, Ser. No. 782,093,filed Dec. 9, 1968, titled Semiconductor Passivanting Process and product, the disclosure of which application is here incorporated by reference. With the passivant deposited in the grooves, the masking material may be entirely removed from the first major surface and selectively removed from the second major surface to allow application of the contact layers 74, 76 and 78 by conventional techniques. The individual semiconductive assemblies 50 may then be separated from the wafer by sawing or scribing along the streets 88 between the glass layers.

In FIG. 6 a semiconductive assembly 50 is sown mounted on an electrically and thermally conductive heat sink 90. The contact layer 74 which covers the first major surface of the semiconductive crystal effectively unites it in intimate thermally and electrically conductive relation to the heat sink. The heat sink is provided along one edge with an integrally formed terminal lead 92. Along a spaced edge the heat sink is provided with a tab 94 having an aperture 96 to facilitate mounting of the semiconductor device and heat removal from the heat sink. The contact layer 76 overlying third zone of the semiconductive crystal is connected to a terminal pin 98 by a fly wire 100. A second fly wire 102 connects the contact layer 78 associated with the second zone with a terminal pin 104. A plastic housing 106 sectioned horizontally in the same plane as the lower surface of the heat sink is shown (partially indicated in dashed outline) enveloping the heat sink and the inner extremities of the terminal leads. The plastic housing is preferably formed of a synthetic resin having high-dielectric properties, such as silicone, phenolic, or epoxy resins. The plastic not only protects the semiconductive assembly but also serves to mount the terminal leads 98 and 104 in the desired orientation with respect to the heat sink.

The semiconductor device shown in FIG. 5 not only exhibits outstanding electrical characteristics, but is also of a construction rendering it conveniently manufacturable. Comparing the semiconductive assembly 50 with the semiconductive assembly 1, a number of distinct advantages are in evidence. By comparing FIGS. 2 and 4 it can be seen that the etching pattern used to form the assemblies 50 leaves a much stronger wafter after etching than with the conventional approach. This is because the wafer of FIG. 2 is joined only by thinned regions underlying the grooves 35. By contrast it can be seen in FIG. 4 that the streets of this wafer form an unweakened interconnecting matrix retaining rigidity and strength in the wafer even after etching.

The semiconductive assembly 50 is superior to the assembly 1 also in that the glass passivant layer is more reliably protected against damage. Whereas to form the assembly 1 two glass layers must be sawn or scribed around the entire periphery of the semiconductive crystal, thereby providing a relatively high probability of damage, in separating the assemblies 50 from a wafter the scribing or sawing is confined to the streets and entirely avoids contact with the glass-passivant layer. Hence a low likelihood of damage of the glass-passivant layer exists. Still further, it is to be noted that the passivant layers are spaced inwardly from the edge of the crystal 51 so that the possibility of damage by mechanical shocks in handling is minimized. This is in direct contrast to the assembly 1 in which two glass layers are located at the edge and are supported by a fragile cantilevered edge portion of the crystal.

In addition to mechanical and fabrication advantages the assembly 50 also possesses distinct electrical advantages over the assembly 1. The central zone which is of the greatest width and highest resistivity in both the crystals 2 and 51 is protected from direct exposure in the latter crystal. This means that no matter how large a voltage is being blocked the depletion layer at no time comes into contact with an unpassivated edge of the crystal. Accordingly, there is no contribution to softening of the blocking characteristics of the crystal from this source. Additionally, it is to be noted that even if some metallization is inadvertently brought into contact with the sawn or scribed edge of the crystal 51, this cannot have a short-circuiting effect since the peripheral zone 82 completely surrounds the central zone. Should metal inadvertently contact the peripheral zone as, for example, in uniting the contact layer to the heat sink 90 no deleterious effect on electrical performance is observed, since the junction 84 prevents a short-circuiting relationship of the junction 60 from arising.

From the foregoing it is apparent that the semiconductive assembly 50 is superior in both mechanical handling and electrical performance characteristics to the semiconductive assembly 1. However, these advantages are not bought at the price of complicated or undesirable manufacturing techniques. Rather, the semiconductive assembly 50 may be formed by wafer-processing techniques generally comparable to those employed in forming the semiconductive assembly 1.

The remainder of the semiconductor device shown in FIG. 5 is also susceptible to low-cost manufacturing techniques. Initially the heat sink 90 and the terminal leads 98 and 104 may be integrally associated in a metal plate having many similar heat sinks and terminal leads laterally spaced. Mounting of the semiconductive assemblies 50 on the heat sinks may be accomplished very rapidly, since only approximate location is required. After the fly wires are attached, the housing 106 for each of the semiconductor devices to be formed from a single metal plate may be simultaneously formed. Thereafter the heat sink and terminal leads are lanced free of the remainder of the metal plate to form the completed device.

While I have described my invention with specific reference to a semiconductor controlled rectifier, it is appreciated that it may be applied to differing forms of semiconductor devices, For example, a thyristor switched by avalanche effects rather than a gate signal may be formed merely by omitting the contact layer 78 from the semiconductive assembly 50.

FIGS. 6 through 8 inclusive illustrate the applicability of our invention to a gate controlled bilateral thyristor or triac assembly 200. The semiconductive assembly 200 is provided with a first layer 202 and a gate layer 204 which are laterally spaced and of like conductivity type. Both the first and gate layers form junctions with a second layer 206 of opposite conductivity type. A central type 208 and emitter layer 212 are of like conductivity type as layers 202 and 204 while fourth layer 210 is of like conductivity type as layer 206. It can thus be seen that in a section through the first layer area the semiconductive element may include a PNPN or NPNP sequence of layers, except for a small area 206A where the second layer 206 extends upwardly through the first layer 202 and only a three layer sequence is present. It can also be seen that a section through the gate layer 204 may include a PNPNP or NPNPN sequence of layers. A contact layer 214 overlies the area defined by dashed lines 216 adjacent one major surface while a second contact layer 218 overlies the entire opposite major surface of the crystal. It is to be noted that both the first and second bonding assemblies overlie both P- and N-conductivity-type regions. A gate contact layer, not shown, overlies the area 222 primarily overlying a portion of the gate layer 204. A small areal portion of the ate contact layer overlies an area 224, which is part of a somewhat larger area 226 of the layer 206. The surface interconnection of the area 226 to the main surface portion of the layer is through a thin and indirect-connecting portion 228. It can be seen that the connecting portion 228 is thin because of the close spacing of the first and gate layers and because of a projecting finger portion 230 associated with the first layer. Since the layer 206 underlies both the first and gate layers, the portion 226 is not dependent on the connecting portion 228 for electrical interconnection with the major portion of the layer 206, but rather this connecting portion serves primarily merely to electrically separate the gate and first layers.

The triac assembly is provided with circumferential border grooves 270 and 271 spaced inwardly from the outer edge of the crystal. A passivant layer 272 is associated with each of the grooves. The grove 270 intersects the edge of the junction 260 between the central layer 208 and the fourth layer 210. The groove 271 intersects the junction 266 between the central layer 208 and the second layer 206. A peripheral zone 282 is provided of a conductivity type opposite to that of the central zone which forms a junction 284 with the central zone. The upper and lower edges of the junction 284 intersect the grooves 270 and 271. The central zone spaced the junction 284 from the junctions 260 and 266.

The basic characteristics of triacs has been widely discussed in numerous patents and publications including the SCR Manual, 4th Edition, published in 1967by the General Electric Company. Accordingly, it is considered unnecessary to describe in detail the operative characteristics of the semiconductive assembly 200 beyond noting the contribution of certain salient features. The area 206A associated with the semiconductive assembly 200 provides a current flow path through the semiconductive crystal parallel to the gate and reduces the sensitivity of the semiconductive crystal to switching to the high-conductivity mode in response to transient current or voltage pulses. The contact area 224 between the gate bonding assembly and the second layer 206 allows a lower gate signal to switch the semiconductive assembly 200 to its high-conductivity mode when the junction between the gate layer and layer 206 is reverse biased. The area 224 is positioned at a somewhat remote location from the main portion of the layer 206 to avoid bringing the entire layer 206 to the potential of the gate. The advantages of the semiconductive assembly 200 are similar to those discussed above with respect to semiconductive assembly 50.

Another exemplary rectifier application of my invention is illustrated in FIG. 9 in which a semiconductive assembly 300 is shown formed of semiconductive crystal 302. The crystal is provided with a central zone 304 which may be of relatively low conductivity N-type or P-type semiconductive materials. A first zone 306 is provided which may be identical to first zone 58 in in configuration. The first zone 306 may be of either N-type or P-type conductivity and will be of lower resistivity than the central zone and of lesser width. The first and central zones form a juncture 310 therebetween which may be identical in configuration to the junction 60. As employed herein the term "juncture" refers to the locus of an abrupt change in conductivity characteristics. At the interface of N-type and P-type conductivity regions the juncture may be a rectifying junction. In other instances where the first and central zones are both of like conductivity type or the central zone is essentially intrinsic the juncture is formed as a result of an abrupt change in the dopant impurity concentration at this location within the crystal. A second zone 308 which may be of either N-type or P-type conductivity, but which is chosen to be of opposite conductivity type from the first zone, forms a juncture 312 with the central zone.

A circumferential border groove 370 extends from the major surface of the crystal adjacent the first zone 306 into intersection with the edge of the juncture 310. The groove 370 is spaced inwardly from the edge of the crystal. At the same time a groove 371 is provided opening from the opposite major surface of the crystal which intersects the peripheral edge of the juncture 312. A dielectric passivant layer 372 is provided in each of the grooves. It is a significant feature that the grooves 370 and 371 are laterally spaced from each other. This offsets any tendency of the grooves to weaken the wafer by reason of the cumulative thinning of the wafer occasioned by alignment of the grooves.

A peripheral zone 374 lies adjacent the outer edge of the crystal. The peripheral zone is of a conductivity type opposite to that of the central zone and forms a junction 376 therewith. A first contact layer 378 lies adjacent one entire major surface of the crystal supporting both the first zone and the peripheral zone. Thus, the peripheral zone of the crystal is not cantilevered as is the edge of the conventional crystal 2, but is securely supported. A contact layer 380 is associated with the second zone. The advantages of the semiconductive assembly 300 are similar to those of the assemblies 50 and 200 discussed above. Additionally, the laterally spacing of the grooves associated with the opposite major surface further contributes to the strength of the wafer from which the assemblies are formed. While this feature is specifically disclosed with respect to the assembly 300 only, it is appreciated that it is clearly applicable to assemblies 50 and 200 with corresponding advantage.

In FIG. 10 still another semiconductive assembly 400 formed according to my invention is illustrated. A semiconductive crystal 402 is provided with a central zone 404 which is spaced from first major surface 406 by a first zone 408. The first and central zones are of opposite conductivity type and form a junction 410 therebetween. The periphery of the junction intersects a circumferential border groove 412 which opens from the first major surface. The groove is spaced inwardly from the outer edge of the crystal. The crystal is provided with a peripheral zone 414 of opposite conductivity type from that of the central zone. The peripheral zone forms a junction 416 with the central zone. The junction 416 intersects the groove.

A dielectric passivant layer 418 is located within the groove and overlies the intersection of the junctions with the groove. An ohmic contact layer 420 overlies the first zone along the first major surface, while a contact layer 422 lies in ohmic contact with the central layer along a second major surface 424.

The semiconductive assembly is noted to constitute a semiconductive diode. It is to be noted that no portion of the semiconductive crystal is cantilevered, no portion of the central zone is exposed, and in subdividing the assembly from a wafer it is unnecessary to scribe or saw the dielectric layer. The general advantages of the semiconductive assembly 400 are similar to those noted in connection with the previously described embodiments of my invention.

It is to be noted that the vertical sectional views of the semiconductive assemblies are somewhat schematic in character with the thickness of the semiconductive crystals being greatly exaggerated as compared to the width, since semiconductive crystals are normally quite thin. In all instances the distance between the peripheral junction's intersection with a groove and the intersection of a remaining junction or juncture with the same groove is greater than the distance between the first and second junctions or junctures or, in FIG. 10, the distance between the first junction and the second major surface of the crystal. This relationship is generally desirable to avoid breakdown of the peripheral junction in use of the semiconductive assemblies. While I have disclosed my invention with specific reference to glass passivants, it is appreciated that any conventional junction passivant may be employed in the practice of my invention, although glass passivants are preferred and are considered particularly advantageous.

What I claim as my invention and desire to secure by Letters Patent of the United States is:

1. The combination comprising:
a semiconductive crystal having first and second major surfaces comprised of
a central zone lying within said crystal adjacent said second major surface and spaced from said first major surface,
a first zone lying between said central zone and said first major surface, said first zone being of a conductivity type opposite from that of said central zone and forming a first junction therewith,
a circumferential border groove spaced inwardly from an outer edge of said crystal and extending inwardly from said first major surface to intersect said first junction, and
a peripheral zone of a conductivity type opposite from that of said central zone extending from said first major surface to said second major surface forming an annular junction with said central zone and said annular junction intersecting said second major surface and the groove from said first zone by a distance greater than the thickness of said central zone measured in a direction normal to said first major surface,
dielectric passivant means overlying the intersections of said junctions with the groove,
first contact means conductively associated with said first zone, and
second contact means conductively associated with said entire second major surface.

2. The combination comprising
a semiconductive crystalline wafer having first and second major surfaces with a plurality of laterally spaced annular first grooves associated with said first major surface and a plurality of laterally spaced annular second grooves associated with said second major surface, each of the first grooves being paired with one of the second grooves, the grooves laterally defining therebetween a plurality of intersecting integral corridors, said semiconductive crystalline wafer being comprised of
a plurality of laterally spaced central zones lying between and spaced from said major surfaces,
a peripheral zone extending between said major surfaces along said corridors and forming annular junctions peripherally of each of said central zones, said annular junctions intersecting the grooves,
a plurality of first and second zones each located laterally interiorly of the annular grooves and lying between said central zones and said first and second major surfaces, respectively, being of a conductivity type opposite from that of said central zone, and
said central zones each forming first and second junctions with said first and second zones, respectively, adjacent thereto, said first junctions peripherally intersecting the first grooves and said second junctions peripherally intersecting the second grooves,
dielectric passivant means overlying the intersections of said junctions with the grooves,
first contact means associated with said first zones, and
second contact means associated with said second zones.

3. The combination according to claim 2 in which said first contact means is an integral contact which additionally overlies said corridors and said dielectric passivant means associated with the first grooves.

4. The combination comprising
a semiconductive crystalline wafer having first and second major surfaces with a plurality of laterally spaced annular grooves associated with said first major surface, the grooves laterally defining therebetween a plurality of intersecting integral corridors, said semiconductive crystalline wafer being comprised of
a plurality of laterally spaced central zones of a first conductivity type spaced from said first major surfaces
a peripheral zone of an opposite conductivity type from that of said central zone extending between said major surfaces along said corridors and forming annular junctions peripherally of each of said central zones, each of said annular junctions intersecting one of the annular grooves,
a plurality of first zones of an opposite conductivity type from that of said central zones located laterally interiorly of the annular grooves and lying between said central zones and said first major surfaces to form rectifying junctions therewith, and
said rectifying junctions lying interiorly of and peripherally intersecting the annular grooves, the distance between the groove intersections of said annular peripheral junctions and said rectifying junctions being greater than the thickness of the central zone measured in a direction normal to said first major surface,
dielectric passivant means overlying the intersections of said junctions with the grooves,
first contact means conductively associated with said first zone, and
second contact means conductively associated with said entire second major surface.

5. The combination according to claim 4 in which said annular junctions intersect said second major surface.

6. The combination according to claim 4 additionally including a plurality of laterally spaced annular grooves associated with said second major surface, the second major surface associated grooves being concentric with and laterally offset from the first major surface grooves.

7. The combination according to claim 4 additionally including a plurality of laterally spaced annular grooves associated with said second major surface and a plurality of laterally spaced second zones adjacent said second major surface lying interiorly of and peripherally intersecting the second major surface associated grooves, said second zones being of like conductivity type as said central zones and of lower resistivity.

8. The combination comprising
a semiconductive crystal having first and second major surfaces comprised of
a central zone lying between and spaced from said major surfaces,
first and second zones lying between said central zone and said first and second major surfaces, respectively, said first and second zones being of opposite conductivity type and of lower resistivity than said central zone,
said central zone being of like conductivity type as said first zone and opposite conductivity type from said second zone so that said central zone forms a juncture with said first zone and rectifying junction with said second zone,
first and second circumferential border grooves spaced inwardly from an outer edge of said crystal being associated with said first and second major surfaces, respectively, and extending inwardly to intersect said juncture and said junction respectively, and
a peripheral zone of a conductivity type opposite from that of said central zone extending from said first major surface to said second major surface to form an annular junction with said central zone and separated by the grooves from said first and second zones, said annular junction at its intersection with the first and second grooves being spaced from said first and second zones, respectively, by a distance greater than the thickness of said central zone measured in a direction normal to said first major surface, dielectric passivant means overlying the intersections of said junctions and said juncture with the grooves, first contact means associated with said first zone, and second contact means associated with said second zone.

* * * * *